US011531044B2

(12) United States Patent
Lee et al.

(10) Patent No.: US 11,531,044 B2
(45) Date of Patent: Dec. 20, 2022

(54) BATTERY PACK, BATTERY MANAGEMENT SYSTEM, AND METHOD THEREFOR

(71) Applicant: Samsung SDI Co., Ltd., Yongin-si (KR)

(72) Inventors: Sanggu Lee, Yongin-si (KR); Youn Gu Kim, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 697 days.

(21) Appl. No.: 16/468,630

(22) PCT Filed: Nov. 1, 2017

(86) PCT No.: PCT/KR2017/012256
§ 371 (c)(1),
(2) Date: Jun. 11, 2019

(87) PCT Pub. No.: WO2018/143541
PCT Pub. Date: Aug. 9, 2018

(65) Prior Publication Data
US 2020/0079240 A1    Mar. 12, 2020

(30) Foreign Application Priority Data

Feb. 2, 2017    (KR) .................. 10-2017-0015182

(51) Int. Cl.
*H02J 7/00* (2006.01)
*G01R 1/20* (2006.01)
(Continued)

(52) U.S. Cl.
CPC ................ *G01R 1/20* (2013.01); *B60L 50/64* (2019.02); *B60L 58/22* (2019.02); *G01R 1/203* (2013.01);
(Continued)

(58) Field of Classification Search
USPC ................. 320/106, 107, 108, 110, 136, 162
See application file for complete search history.

(56) References Cited

U.S. PATENT DOCUMENTS 5,955,869 A * 9/1999 Rathmann .......... G01R 31/3648
320/132
2005/0017676 A1  1/2005 Takimoto et al.
(Continued)

FOREIGN PATENT DOCUMENTS

CN    102005733 B  *  6/2014  .......... G06F 1/1635
EP       1533881 A2     5/2005
(Continued)

OTHER PUBLICATIONS

EPO Office Action dated Nov. 11, 2021, issued in corresponding European Patent Application No. 17895078.8 (6 pages).
(Continued)

*Primary Examiner* — Brian Ngo
(74) *Attorney, Agent, or Firm* — Lewis Roca Rothgerber Christie LLP

(57) ABSTRACT

A battery management system may include: a charge control switch disposed in a high current path between a plurality of pack terminals and a battery module; and a controller configured to detect a cell voltage of each of a plurality of cells included in the battery module and a charging current flowing through a high current path, to determine an overvoltage state of the battery module based on presence or absence of the charging current and the cell voltage of each of the cells, and to turn off the charge control switch when the battery module is determined to be in an overvoltage state.

10 Claims, 4 Drawing Sheets

(51) Int. Cl.
  *G01R 31/382* (2019.01)
  *B60L 58/22* (2019.01)
  *H01M 10/42* (2006.01)
  *B60L 50/64* (2019.01)

(52) U.S. Cl.
  CPC .......... *G01R 31/382* (2019.01); *H01M 10/42* (2013.01); *H02J 7/0014* (2013.01); *H02J 7/0031* (2013.01); *H01M 2010/4271* (2013.01)

(56) References Cited

U.S. PATENT DOCUMENTS

| | | | |
|---|---|---|---|
| 2005/0083797 A1 | 4/2005 | Shigeeda et al. | |
| 2005/0242779 A1 | 11/2005 | Yoshio | |
| 2006/0139006 A1 | 6/2006 | Wang et al. | |
| 2008/0218130 A1 | 9/2008 | Guo et al. | |
| 2009/0009143 A1* | 1/2009 | Odaohhara | H02J 7/04 320/162 |
| 2011/0050175 A1* | 3/2011 | Odaohhara | H01M 10/443 320/136 |
| 2013/0026994 A1 | 1/2013 | Morikawa | |
| 2013/0202918 A1 | 8/2013 | Kimura | |
| 2014/0016239 A1* | 1/2014 | Kim | H02H 3/006 327/279 |
| 2015/0196768 A1* | 7/2015 | Marnfeldt | H02J 7/0077 607/60 |
| 2016/0193925 A1 | 7/2016 | Takada et al. | |

FOREIGN PATENT DOCUMENTS

| | | | | |
|---|---|---|---|---|
| EP | 3032633 | A1 | 6/2016 | |
| FR | 2880738 | A1 * | 7/2006 | ............ H02J 7/0073 |
| JP | 11-196533 | A | 7/1999 | |
| JP | 2007-20399 | A | 1/2007 | |
| JP | 3905005 | B2 | 4/2007 | |
| JP | 2009-100596 | A | 5/2009 | |
| JP | 2009-247195 | A | 10/2009 | |
| JP | 2012015094 | A * | 1/2012 | ............ B60L 3/0046 |
| JP | 2012235611 | A * | 11/2012 | ....... G01R 19/16542 |
| JP | 5502216 | B1 * | 5/2014 | ............ H02H 11/002 |
| JP | 5606997 | B2 | 10/2014 | |
| JP | 2015-186266 | A | 10/2015 | |
| KR | 10-2005-0026360 | A | 3/2005 | |
| KR | 10-2016-0135646 | A | 11/2016 | |
| TW | 200406966 | A * | 5/2004 | ............ H02J 7/0068 |
| TW | 201136082 | A * | 10/2011 | ............ H01M 10/441 |

OTHER PUBLICATIONS

EPO Extended Search Report dated Feb. 21, 2020, for corresponding European Patent Application No. 17895078.8 (8 pages).
Office Action; corresponding EPO Application No. 17895078.8, dated Apr. 1, 2022, 6 pages.

* cited by examiner

FIG. 4

| Case | Maximum cell voltage | Charging current | Charge control switch | Discharge control switch |
|---|---|---|---|---|
| 1 | First threshold ≤ Maximum cell voltage < Second threshold | Presence | Turn off (block) | Maintain current state |
| 2 | First threshold ≤ Maximum cell voltage < Second threshold | Absence | Maintain current state | Maintain current state |
| 3 | Second threshold ≤ Maximum cell voltage | Presence | Turn off (block) | Turn off (block) |
| 4 | Second threshold ≤ Maximum cell voltage | Absence | Maintain current state | Maintain current state |

BATTERY PACK, BATTERY MANAGEMENT SYSTEM, AND METHOD THEREFOR

CROSS-REFERENCE TO RELATED APPLICATION(S)

This application is a National Phase Patent Application of International Patent Application Number PCT/KR2017/012256, filed on Nov. 1, 2017, which claims priority of Korean Patent Application No. 10-2017-0015182, filed Feb. 2, 2017. The entire contents of both of which are incorporated herein by reference.

TECHNICAL FIELD

An exemplary embodiment relates to a battery pack, a battery management system, and a method thereof.

BACKGROUND ART

A multi-series battery pack including secondary cells capable of charging and discharging is equipped with a battery management system that performs an overvoltage protection function, a charge/discharge control function, and a cell balancing control function.

A voltage imbalance phenomenon between cells may occur due to a difference in characteristics between cells in all systems using secondary cells that are connected in series or in parallel. The characteristic difference between the cells makes a charge amount of each cell non-uniform, which causes capacity or voltage of the cells to become non-uniform, thereby deteriorating the performance of the secondary cells. Therefore, the battery management system includes a cell balancing circuit to eliminate voltage non-uniformity between cells.

The battery management system may monitor the voltage of the secondary cells (or battery modules) that constitute a battery pack in real time through the cell balancing circuit, and may control a charge control switch or a discharge control switch to stop charging and discharging of the battery pack.

In general, a wire connector (wire connector) is used to connect the cell balancing circuit to each cell that is accommodated in the battery module. When the wire connector is exposed to a swinging or vibration environment, contact resistance may be changed due to contact failure of a connector terminal thereof.

In addition, contact failure may occur due to an adhesive that is applied to the connector terminal to prevent the swinging of the connector terminal of the wire connector, thereby changing the contact resistance.

Poor contact of the wire connector terminal for connecting each cell and the cell balancing circuit may cause a situation where an overvoltage state is erroneously determined by a battery management system that detects a voltage of each cell using the cell balancing circuit, which may lead to a malfunction that stops an operation of a driving device equipped with the battery pack such as an electric bicycle by interrupting power supply of the driving device.

DISCLOSURE

An exemplary embodiment has been made in an effort to provide a battery pack, a battery management system, and a method for preventing erroneous determination of a contact failure of a wire connector terminal for connecting each cell and a cell balancing circuit as an overvoltage state.

An exemplary embodiment of the present invention provides a battery management system including: a charge control switch disposed in a high current path between a plurality of pack terminals and a battery module; and a controller configured to detect a cell voltage of each of a plurality of cells included in the battery module and a charging current flowing through a high current path, to determine an overvoltage state of the battery module based on presence or absence of the charging current and the cell voltage of each of the cells, and to turn off the charge control switch when the battery module is determined to be in an overvoltage state.

The battery management system may further include a current sensing resistor connected in series to the high current path, and the controller may include a current detection circuit connected to opposite ends of the current sensing resistor to detect the charging current through the current detection circuit.

The controller may determine that the battery module is in the overvoltage state when a maximum cell voltage among the cell voltages of the cells is equal to or greater than a first threshold value in a state where the charging current flows.

The battery management system may further include a discharge control switch disposed in the high current path, the controller may turn off the discharge control switch when the maximum cell voltage is equal to or higher than a second threshold value in a state where the charging current flows, and the second threshold value may be higher than the first threshold value.

The controller may include a voltage detection circuit connected to each of the cells through a balancing connector.

An exemplary embodiment of the present invention provides a battery pack including: a plurality of pack terminals; a battery module configured to include a plurality of cells; a balancing connector connected to each of the cells; a charge control switch disposed in a high current path between the pack terminals and the battery module; and a controller connected with each of the cells through the balancing connector, and configured to detect a cell voltage of each of the cells and a charging current flowing through a high current path, to determine an overvoltage state of the battery module based on presence or absence of the charging current and the cell voltage of each of the cells, and to turn off the charge control switch when the battery module is determined to be in an overvoltage state.

The battery pack may further include a current sensing resistor connected in series with the high current path, and the controller may include a current detection circuit connected to opposite ends of the current sensing resistor to detect the charging current through the current detection circuit.

The controller of the battery pack may determine that the battery module is in the overvoltage state when a maximum cell voltage among the cell voltages of the cells is equal to or greater than a first threshold value in a state where the charging current flows.

The battery pack may further include a discharge control switch disposed in the high current path, the controller may turn off the discharge control switch when the maximum cell voltage is equal to or higher than a second threshold value in a state where the charging current flows, and the second threshold value may be higher than the first threshold value.

An exemplary embodiment of the present invention provides a battery management method of a battery management system including a charge control switch and a discharge control switch connected to a high current path between an external device and a battery module, including: detecting a charging current flowing through the current path; detecting a voltage of each of a plurality of cells included in the battery module; determining an overvoltage state of the battery module based on presence or absence of the charging current and the cell voltage of each of the cells; and turning off the charge control switch when the battery module is determined to be in an overvoltage state.

The detecting of the charging current may include detecting the charging current by detecting a current flowing through a current sensing resistor connected in series to the high current path.

The determining may include determining that the battery module is in the overvoltage state when a maximum cell voltage among the cell voltages of the cells is equal to or greater than a first threshold value in a state where the charging current flows.

The battery management method further includes turning off the discharge control switch when the maximum cell voltage is equal to or higher than a second threshold value in a state where the charging current flows, and the second threshold value may be higher than the first threshold value. According to the exemplary embodiments, contact failure of the wire connector terminals connecting each cell and the cell balancing circuit may be prevented from being erroneously determined as the overvoltage state.

DESCRIPTION OF THE DRAWINGS

FIG. 4 illustrates the battery management method of FIG. 3

MODE FOR INVENTION

Figure 1:
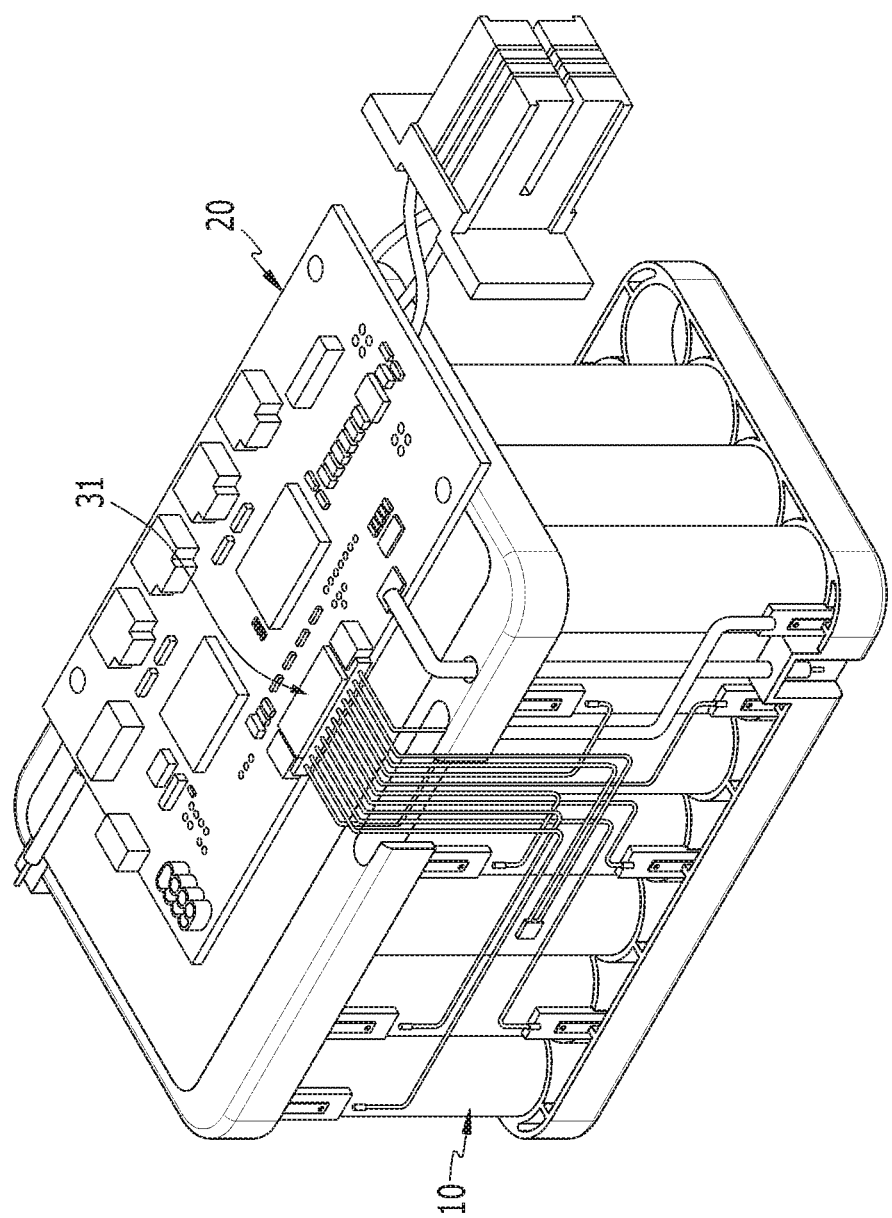
FIG. 1 schematically illustrates a battery pack according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

To clearly describe the exemplary embodiments, parts that are irrelevant to the description are omitted, and like numerals refer to like or similar constituent elements throughout the specification. Therefore, the reference numbers of the constituent elements used in a previous drawing may be used in a subsequent drawing.

Further, since sizes and thicknesses of constituent members shown in the accompanying drawings are arbitrarily given for better understanding and ease of description, the exemplary embodiments are not limited to the illustrated sizes and thicknesses. In the drawings, the thickness of layers, films, panels, regions, etc., are exaggerated for clarity.

A case of electrically connecting two constituent elements includes not only a case of directly connecting the constituent elements but also a case of connecting the constituent elements via another constituent element therebetween. The constituent element therebetween may include a switch, a resistor, a capacitor, and the like. In describing exemplary embodiments, an expression of connection indicates electrical connection unless explicitly described to be direct connection.

Hereinafter, a battery management system and a method thereof according to an exemplary embodiment will be described in detail with necessary drawings.

Figure 2:
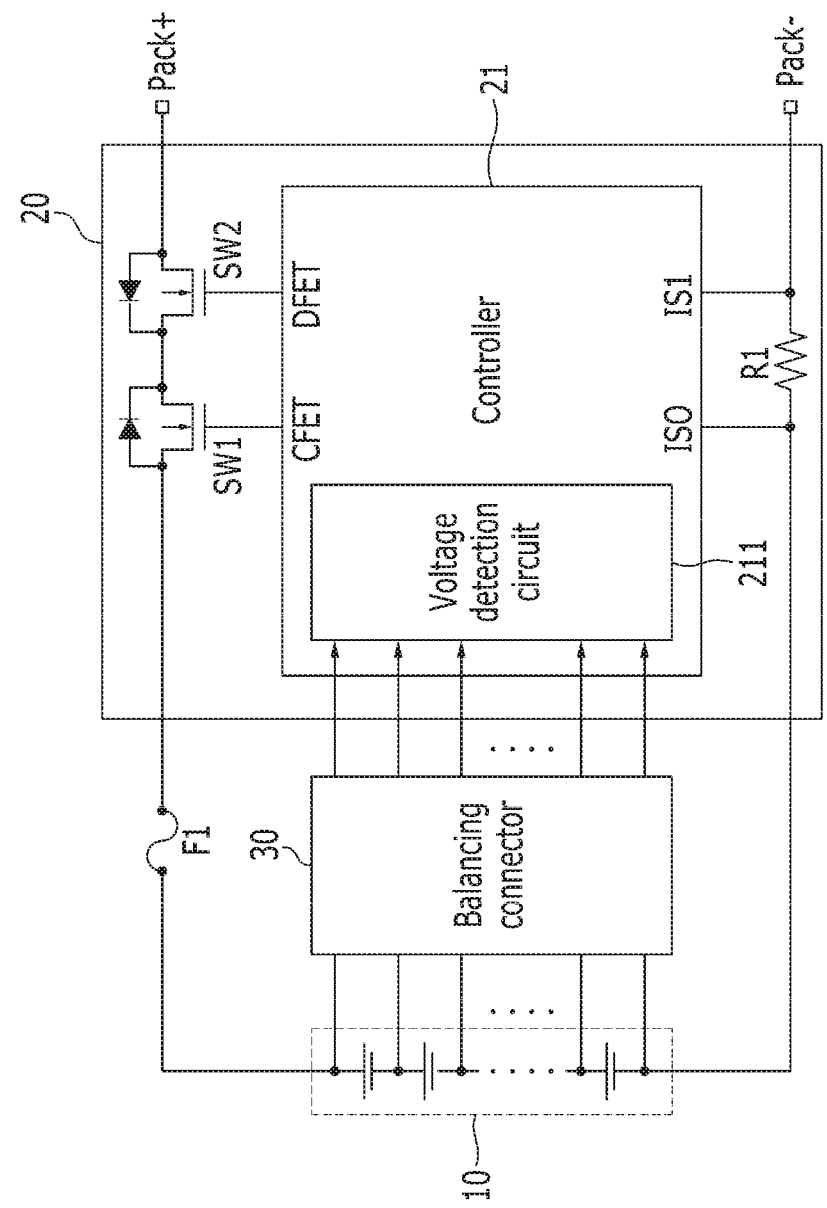
FIG. 2 schematically illustrates a battery management system according to an exemplary embodiment.

FIG. 1 illustrates an example of a battery pack according to an exemplary embodiment, and FIG. 2 illustrates an example of a battery management system according to an exemplary embodiment.

Referring to FIG. 1 and FIG. 2, a battery pack according to the present exemplary embodiment may include a plurality of pack terminals Pack+ and Pack−, a battery module 10, a battery management system 20, a balancing connector 30, and a fuse F1.

The battery module 10 includes a plurality of cells that are connected in series or in parallel with each other.

The battery module 10 may be connected to an external charging device (not illustrated) or a load (not illustrated) through the pack terminals Pack+ and Pack−.

The battery module 10 may receive a charging current from a charging device connected through the pack terminals Pack+ and Pack−. In addition, the battery module 10 may supply a discharging current to the load connected through the pack terminals Pack+ and Pack−. In this document, a path through which a charging current or a discharging current flows between the battery module 10 and the pack terminals Pack+ and Pack− is referred to as a "high current path."

The fuse F1 may be connected to the high current path between the battery module 10 and the pack terminals Pack+ and Pack− to block the high current path.

The battery management system 20 may control an overall operation of the battery pack 1.

Referring to FIG. 2, a battery management system 20 according to the present exemplary embodiment may include a charge control switch SW1, a discharge control switch SW2, a current sensing resistor R1, and a controller 21. Some constituent elements illustrated in FIG. 2 are not essential, and thus the battery management system 20 may be implemented to include more or fewer constituent elements. For example, the battery management system 20 may further include a cell balancing circuit (not illustrated).

The charge control switch SW1 is turned on and off by a control signal inputted from the controller 21 so as to block or allow a flow of the charging current supplied from the external charging device to the battery module 10 through the high current path. When the charge control switch SW1 is turned on, the charge control switch SW1 may be in an electrical connection state, to allow the charging current to flow from the charge device to the battery module 10 through the high current path. On the other hand, when the charge control switch SW1 is turned off, the charging current flowing in the high current path between the charging device and the battery module 10 may be blocked.

For example, referring to FIG. 1, the charge control switch SW1 may be connected to the high current path between a positive terminal BAT+ of the battery module 10 and the pack terminal Pack+. However, the present invention is not so limited thereto. According to another exemplary embodiment, the charge control switch SW1 may be connected between a negative terminal BAT− of the battery module 10 and the pack terminal Pack−.

The discharge control switch SW2 is turned on and off by a control signal inputted from the controller 21 so as to block or allow a flow of the discharging current supplied from the battery module 10 to an external load through the high current path. When the discharge control switch SW2 is turned on, the discharge control switch SW2 may be in the electrical connection state, to allow the discharging current to flow from the battery module 10 to the load through the high current path. On the other hand, when the discharge control switch SW2 is turned off, the discharging current flowing in the high current path between the battery module 10 and the load may be blocked.

For example, referring to FIG. 1, the discharge control switch SW2 may be connected to the high current path between the positive terminal BAT+ of the battery module 10 and the pack terminal Pack+. However, the present invention is not so limited thereto. According to another exemplary embodiment, the discharge control switch SW2 may be connected between the negative terminal BAT− of the battery module 10 and the pack terminal Pack−.

Each of the charge control switch SW1 and the discharge control switch SW2 may be a field effect transistor (FET).

The current sensing resistor R1 may be connected in series to the high current path, and may be used to measure a current (e.g., the charging current) flowing through the high current path. For example, referring to FIG. 1, the current sensing resistor R1 may be connected between the negative terminal BAT− of the battery module 10 and the pack terminal Pack−. However, the present invention is not so limited thereto. For example, referring to FIG. 1, the current sensing resistor R1 may be connected to the high current path between the positive terminal BAT+ of the battery module 10 and the pack terminal Pack−.

The controller 21 may control an overall operation of the battery management system 20.

The controller 21 may output a control signal to the charge control switch SW1 or the discharge control switch SW2 to control ON and OFF of the charge control switch SW1 or the discharge control switch SW2.

The controller 21 may include a current detection circuit (not illustrated) electrically connected to opposite ends of the current sensing resistor R1 through current measurement terminals IS0 and 1S1, and a current flowing through the current sensing resistor R1 may be measured through the current detection circuit. Since the current sensing resistor R1 is disposed on the high current path between the battery module 10 and one of the pack terminals Pack−, the controller 21 may measure the current (e.g., the charging current) through the high current path by measuring the current flowing through the current sensing resistor R1.

The controller 21 may include a voltage detection circuit 211 connected to each of the cells constituting the battery module 10 through the balancing connector 30, and may detect a voltage of each of at least one of the cells constituting the battery module 10. The controller 21 may also detect a voltage between opposite ends of the battery module 10 through the voltage detection circuit 211.

The controller 21 may control cell balancing of the cell balancing circuit (not illustrated) based on the voltage of each cell.

The controller 21 may detect an overvoltage state of the battery module 10 based on the voltage of each cell.

Referring to FIG. 1, as the battery management system 20 may be mounted on a separate board from the battery module 10, the balancing connector 30 in the form of a wire connector may be used to electrically connect the battery management system 20 to each cell included in the battery module 10.

When the battery pack 1 is exposed to a fluid or vibrating environment, each connector terminal (or connector pin) that is electrically connected to each cell and the battery management system 20 in the balancing connector 30 may be shaken to cause a contact failure. In addition, even when an adhesive agent is applied to prevent the connector terminals (or connector pins) from being shaken, contact failure of the connector terminals (or connector pins) constituting the balancing connector 30 may occur.

When a contact failure of the connector terminals (or connector pins) constituting the balancing connector 30 occurs, either one of opposite ends of each cell may become disconnected from the voltage detection circuit 211 of the battery management system 20. In this case, the voltage at a side of the connector terminal where the contact failure occurs may not be recognized, and the cell voltage measured in this state may be increased even when it is not being charged.

This causes the controller 21 to recognize that the battery pack 1 is in an overvoltage state due to a voltage erroneously measured by a contact failure of the connector terminals (or connector pins) constituting the balancing connector 30, and thus may cause a malfunction that stops charging and discharging of the battery pack 1. Such a malfunction causes a phenomenon in which a driving device such as an electric bicycle equipped with the battery pack 1 suddenly stops while driving, causing safety problems and user dissatisfaction.

Accordingly, the controller 21 may determine the overvoltage state of the battery module 10 based on the presence or absence of the charging current flowing through the current sensing resistor R1 together with the voltage of each cell, in order to prevent the malfunction caused by the contact failure of the balancing connector 30.

For example, when a maximum cell voltage detected through the voltage detection circuit 211 is included in an overvoltage range while the charging current flows through the current sensing resistor R1, the controller 21 may determine that the battery module 10 is in an overvoltage state.

For example, when the maximum cell voltage detected through the voltage detection circuit 211 is included in the overvoltage range in a state in which the charging current does not flow through the current sensing resistor R1, the controller may suspend the determination that the battery module 10 is in the overvoltage state.

The controller 21 may control turn-off of the charge control switch SW1 and the discharge control switch SW2 depending on a determination result of the overvoltage state.

For example, when the battery module 10 is determined to be in the overvoltage state, the controller 21 may turn off the charge control switch SW1 or may turn off the charge control switch SW1 and the discharge control switch SW2.

In the aforementioned exemplary embodiment, a function of the controller 21 constituting the battery management system 20 may be performed by a processor implemented as at least one central processing unit (CPU) or another chipset, a microcontroller unit (MCU), a microprocessor, or the like. For example, the function of the controller 21 may be performed by an analog front end (AFE) IC, a cell voltage monitoring (CVM) IC, or the like.

Hereinafter, a battery management method of the battery management system 20 according to an exemplary embodiment will be described in detail with reference to FIG. 3 and FIG. 4.

Figure 3:
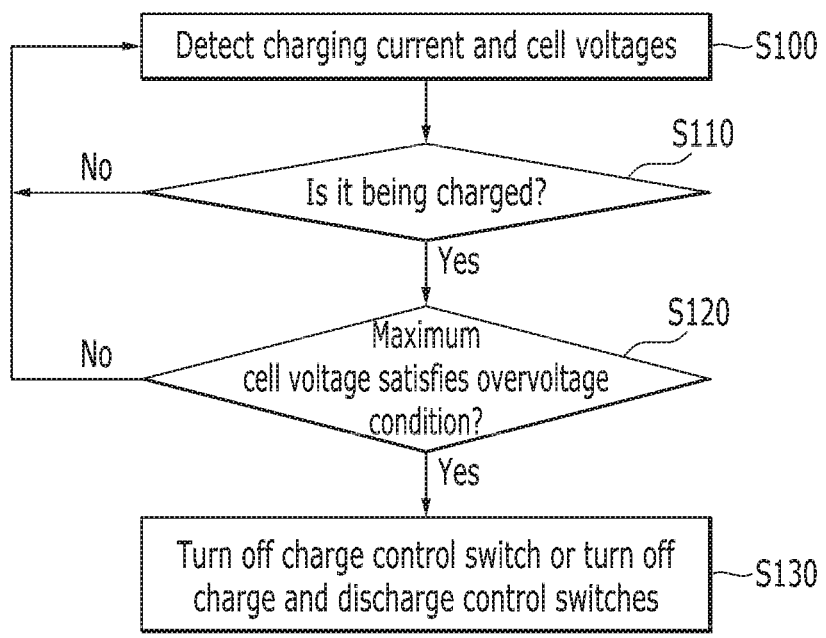
FIG. 3 schematically illustrates a battery management method of a battery management system according to an exemplary embodiment.

FIG. 3 schematically illustrates the battery management method of the battery management system 20 according to the present exemplary embodiment, and FIG. 4 illustrates the battery management method of FIG. 3. The battery management method of FIG. 3 may be performed by the controller 21 of the battery management system 20 described with reference to FIG. 2.

Referring to FIG. 3, the controller 21 of the battery management system 20 according to the present exemplary embodiment detects a cell voltage of each of the cells connected through the balancing connector 30 and a charging current flowing through the large current path (S100).

In step S100, the controller 21 may detect the cell voltage of each of the cells included in the battery module 10 through the voltage detection circuit 211.

In addition, in step S100, the controller 21 may detect a charging current flowing through the current sensing resistor R1, i.e., the high current path through the current detection circuit (not illustrated).

The controller 21 determines whether the battery pack 1 is being charged based on the charging current detected in step S100 (S110).

In step S110, the controller 21 may determine that the current battery module 10 is being charged when the charging current flowing through the high current path is detected through step S100.

When it is determined that the battery module 10 is currently being charged, the controller 21 determines whether the cell voltage of each cell detected in step S100 satisfies an overvoltage condition (S120).

In step S120, the controller 21 may determine that the overvoltage condition is satisfied when the maximum cell voltage of the cell voltages of the cells is equal to or greater than a first threshold value (e.g., 4.25 V). Herein, the first threshold value is a boundary value between the normal region and the overvoltage region, and may be set differently depending on a voltage characteristic of the battery module 10.

When it is determined in step S120 that the overvoltage condition is satisfied, the controller 21 may turn off the charge control switch SW1 or may turn off the charge control switch SW1 and the discharge control switch SW2 in step S130.

FIG. 4 illustrates a table summarizing a control method of the charge control switch SW1 and the discharge control switch SW2 by the controller 21 in step S130.

Referring to FIG. 4, in the case where no charging current exists as in cases 2 and 4, the controller 21 may maintain current states of the charge control switch SW1 and the discharge control switch SW2 even when the maximum cell voltage detected through the voltage detection circuit 211 satisfies the overvoltage condition (first threshold≤maximum cell voltage<second threshold value, or second threshold≤maximum cell voltage). On the other hand, when the maximum cell voltage detected through the voltage detection circuit 211 is equal to or higher than the first threshold (e.g., 4.25 V) and is smaller than the second threshold (e.g., 4.35 V) as in case 1, the controller 21 may only turn off the charge control switch SW1. In this case, the controller 21 may turn on the charge control switch SW1 again when the maximum cell voltage detected through the voltage detection circuit 211 falls below a third threshold value (e.g., 4.2 V).

In addition, when the maximum cell voltage detected through the voltage detection circuit 211 is equal to or higher than the second threshold value (e.g., 4.35 V) in a state in which the charging current flows as in case 3, the controller 21 may turn off both the charge control switch SW1 and the discharge control switch SW2. In this case, the controller 21 may determine that a safety problem has occurred in the battery pack 1, so as to stop charging and discharging operations of the battery pack 1.

According to the above-described exemplary embodiment, the battery management system 20 may prevent erroneous overvoltage determination caused by contact failure of the balancing connector 30 by using the charging current as a determination parameter when determining the overvoltage state of the battery module 10. Accordingly, it is possible to ameliorate a situation that the faulty contact of the balancing connector 30 is erroneously determined as the overvoltage state of the battery module 10, thereby stopping the driving device while driving.

While exemplary embodiments of the present invention have been particularly shown and described with reference to the accompanying drawings, the specific terms used herein are only for the purpose of describing the invention and are not intended to define the meanings thereof or be limiting of the scope of the invention set forth in the claims. Therefore, those skilled in the art will understand that various modifications and other equivalent embodiments of the present invention are possible. Consequently, the true technical protective scope of the present invention must be determined based on the technical spirit of the appended claims.

DESCRIPTION OF SYMBOLS

1: battery pack
10: battery module
20: battery management system
30: balancing connector
21: controller
211: voltage detection integrated circuit
SW1: charge control switch
SW2: discharge control switch
R1: current sensing resistor

The invention claimed is:

1. A battery management system comprising:
a charge control switch and a discharge control switch disposed in a high current path between a plurality of pack terminals and a battery module; and
a controller configured to:
 detect cell voltages of a plurality of cells included in the battery module;
 detect a charging current flowing through the high current path;
 determine an overvoltage state of the battery module based on presence or absence of the charging current and the cell voltages of the plurality of cells;
 turn off the charge control switch when the battery module is determined to be in an overvoltage state;
 determine that the battery module is in the overvoltage state when a maximum cell voltage among the cell voltages of the plurality of cells is equal to or greater than a first threshold value in a state where the charging current flows; and
 maintain current states of the charge control switch and the discharge control switch when the maximum cell voltage is equal to or greater than the first threshold value in a state in which the charging current does not flow.

2. The battery management system of claim 1, further comprising a current sensing resistor connected in series to the high current path, wherein the controller includes a current detection circuit connected to opposite ends of the current sensing resistor to detect the charging current through the current detection circuit.

3. The battery management system of claim 1, wherein the controller is configured to turn off the discharge control switch when the maximum cell voltage is equal to or higher than a second threshold value in a state where the charging current flows, the second threshold value being higher than the first threshold value.

4. The battery management system of claim 1, wherein the controller includes a voltage detection circuit connected to each of the plurality of cells through a balancing connector.

5. A battery pack comprising:
   a plurality of pack terminals;
   a battery module configured to include a plurality of cells;
   a balancing connector connected to each of the plurality of cells;
   a charge control switch and a discharge control switch disposed in a high current path between the pack terminals and the battery module; and
   a controller connected with the plurality of cells through the balancing connector, and configured to detect cell voltages of the plurality of cells, to detect a charging current flowing through a high current path, to determine an overvoltage state of the battery module based on presence or absence of the charging current and the cell voltages of the plurality of cells, to turn off the charge control switch when the battery module is determined to be in an overvoltage state, to determine that the battery module is in the overvoltage state when a maximum cell voltage among the cell voltages of the plurality of cells is equal to or greater than a first threshold value in a state where the charging current flows, and to maintain current states of the charge control switch and the discharge control switch when the maximum cell voltage is equal to or greater than the first threshold value in a state in which the charging current does not flow.

6. The battery pack of claim 5, further comprising a current sensing resistor connected in series with the high current path,
wherein the controller includes a current detection circuit connected to opposite ends of the current sensing resistor to detect the charging current through the current detection circuit.

7. The battery pack of claim 5, wherein the controller is configured to turn off the discharge control switch when the maximum cell voltage is equal to or higher than a second threshold value in a state where the charging current flows, the second threshold value being higher than the first threshold value.

8. A battery management method of a battery management system including a charge control switch and a discharge control switch connected to a high current path between an external device and a battery module, the method comprising:
   detecting a charging current flowing through the high current path;
   detecting cell voltages of a plurality of cells included in the battery module;
   determining an overvoltage state of the battery module based on presence or absence of the charging current and the cell voltages of the plurality of cells;
   turning off the charge control switch when a maximum cell voltage among the cell voltages of the plurality of cells is equal to or greater than a first threshold value in a state where the charging current flows; and
   maintaining current states of the charge control switch and the discharge control switch when the maximum cell voltage is equal to or greater than the first threshold value in a state in which the charging current does not flow.

9. The battery management method of claim 8, wherein the detecting of the charging current includes detecting the charging current by detecting a current flowing through a current sensing resistor connected in series to the high current path.

10. The battery management method of claim 8, further comprising turning off the discharge control switch when the maximum cell voltage is equal to or higher than a second threshold value in a state where the charging current flows, wherein the second threshold value is higher than the first threshold value.

* * * * *